United States Patent
He

(10) Patent No.: US 7,256,655 B2
(45) Date of Patent: Aug. 14, 2007

(54) PHASE-LOCKED LOOP APPARATUS AND METHOD THEREOF

(75) Inventor: Wei-Hung He, Taipei Hsien (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 65 days.

(21) Appl. No.: 11/163,508

(22) Filed: Oct. 20, 2005

(65) Prior Publication Data

US 2006/0097794 A1    May 11, 2006

(30) Foreign Application Priority Data

Oct. 22, 2004    (TW) .............................. 93132197 A

(51) Int. Cl.
*H03L 7/00*    (2006.01)

(52) U.S. Cl. .......................................... 331/11; 331/17

(58) Field of Classification Search .................. 331/11, 331/17; 369/47.28
See application file for complete search history.

(56) References Cited

U.S. PATENT DOCUMENTS

2004/0095863 A1    5/2004    Verboom et al.

*Primary Examiner*—Joseph Chang
(74) *Attorney, Agent, or Firm*—Winston Hsu

(57) ABSTRACT

A PLL device includes a first hybrid PLL and a second digital phase/frequency detection module. The second digital phase/frequency detection module and the first hybrid PLL's oscillator, switching unit, and analog control signal generating module are capable of forming a second hybrid PLL. The switching unit selectively activates either the first hybrid PLL or the second hybrid PLL according to a selection signal to generate an analog control signal with the analog control signal generating module for controlling the oscillator, in order to control the frequency of a clock signal generated by the oscillator.

13 Claims, 3 Drawing Sheets

PHASE-LOCKED LOOP APPARATUS AND METHOD THEREOF

BACKGROUND OF THE INVENTION

1. Field of the Invention

The present invention relates to phase-locked loops (PLL), and more particularly, to PLLs utilized in optical disc drives.

2. Description of the Prior Art

Phase-locked loops (PLLs) include analog PLLs, digital PLLs, and hybrid PLLs, where hybrid PLLs have both digital components and analog components for locking on a reference signal to generate an oscillating clock signal.

In addition to comprising a PLL for locking on an RF signal read from a pickup head, an optical disc drive further comprises a PLL for locking on a wobble signal read from the pickup head, in order to support reading and writing operations of the optical disc drive. Furthermore, in order to maintain output of a steady clock signal while switching between a reading mode and a writing mode of the optical disc drive, an analog circuit design can be utilized to combine the PLL for locking on the RF signal and the PLL for locking on the wobble signal, so that the two PLLs share a common portion of components and thereby maintain a steady clock signal output.

However, the analog circuit design of implementing a combined circuit of two PLLs mentioned above does not have the advantages of digital circuitries, such as high adjustability, and greater tolerance to inaccuracy caused by manufacturing process variations.

SUMMARY OF THE INVENTION

It is therefore an objective of the present invention to provide a phase-locked loop (PLL) apparatus and related methods, in order to utilize hybrid PLL design (i.e., one including digital design and analog design) to implement a combined circuit of a PLL for locking on a radio frequency (RF) signal and a PLL for locking on a wobble signal.

According to one embodiment of the present invention, a PLL apparatus is disclosed. The PLL apparatus comprises: a first digital phase frequency detector (PFD) for generating a first phase frequency detection signal according to a first signal; a second digital PFD for generating a second phase frequency detection signal according to a second signal; a switching unit coupled to the first and second digital PFDs for selectively outputting the first phase frequency detection signal or the second phase frequency detection signal according to a selection signal; a digital loop filter (LF) coupled to the switching unit for filtering the signal outputted by the switching unit; and an oscillator coupled to the digital LF for generating an oscillation signal according to a filtered result generated by the digital LF.

According to one embodiment of the present invention, a phase-locking method of an optical disc drive is further disclosed. The phase-locking method comprises: digitally detecting the phase and frequency of an RF signal according to an oscillation signal to generate a first phase frequency detection signal; digitally detecting the phase and frequency of a wobble signal according to the oscillation signal to generate a second phase frequency detection signal; selectively outputting the first phase frequency detection signal or the second phase frequency detection signal; digitally loop-filtering the outputted signal to generate a loop-filtered signal; and generating the oscillation signal according to the loop-filtered signal.

According to one embodiment of the present invention, a digital phase frequency detection method of a PLL apparatus is further disclosed. The digital phase frequency detection method is utilized for performing phase frequency detection on a digital signal according to a clock signal generated by an oscillator of the PLL apparatus to generate a phase frequency detection signal. The digital phase frequency detection method comprises: detecting the waveform of the digital signal to generate an edge detection signal; counting the clock signal to generate a count value, and generating a trigger signal when the count value reaches a predetermined value; comparing phases of the edge detection signal and the trigger signal to generate a rising signal and a falling signal; and calculating a difference value between the number of times that the rising signal appears and the number of times that the falling signal appears in order to generate the phase frequency detection signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
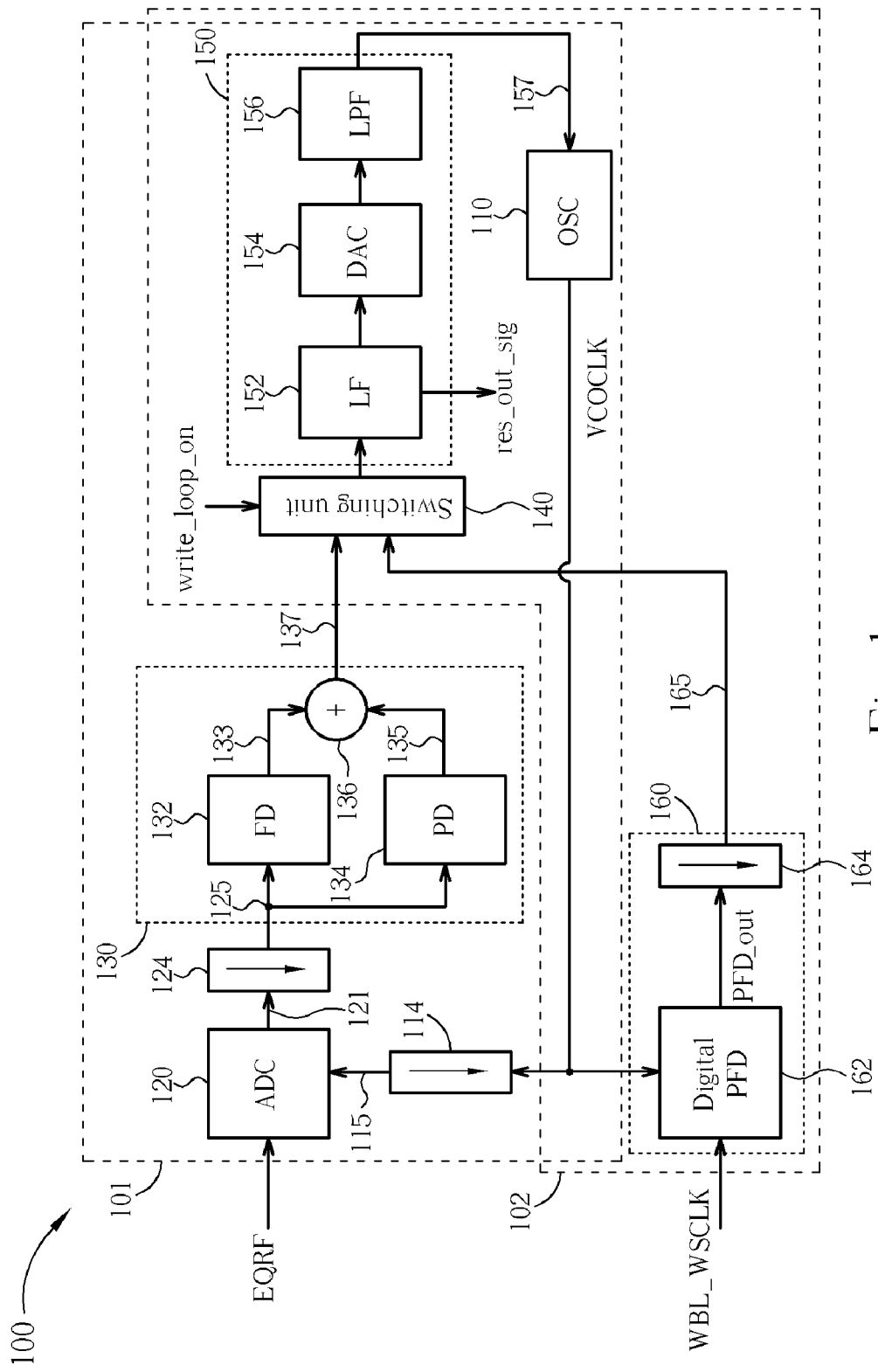
FIG. 1 is a diagram of a phase-locked loop (PLL) apparatus according to one embodiment of the present invention.

Please refer to FIG. 1. FIG. 1 is a diagram of a phase-locked loop (PLL) apparatus 100 according to one embodiment of the present invention. In this embodiment, the PLL apparatus 100 is utilized in an optical disc drive and utilized for locking on an RF signal and/or a wobble signal in a reading mode or a writing mode of the optical disc drive. The PLL apparatus 100 comprises a first PLL 101 and a digital phase frequency detection module 160. The first PLL 101 comprises: an oscillator 110, a frequency dividing unit 114, an analog-to-digital converter (ADC) 120, another frequency dividing unit, which is a digital down-sampling unit 124 in this embodiment, a digital phase frequency detection module 130, a switching unit 140, and an analog control signal generating module 150.

As shown in FIG. 1, the digital phase frequency detection module 130 comprises a frequency detector (FD) 132, a phase detector (PD) 134, and an arithmetic circuit 136, which is an adder in this embodiment. Configurations and operation principles of these circuit components are well known in the art and therefore not explained in detail herein. The analog control signal generating module 150 comprises a loop filter (LF) 152, a digital-to-analog converter (DAC) 154, and a low-pass filter (LPF) 156. It is noted that in this embodiment, the LF 152 is a digital LF coupled to the LPF 156 through the DAC 154, where the LPF 156 is an analog LPF.

As shown in FIG. 1, the oscillator 110, the switching unit 140, and the analog control signal generating module 150 of the first PLL 101, and the digital phase frequency detection module 160 constitute a second PLL 102. The switching unit 140 selectively outputs a phase frequency detection signal 137 or a phase frequency detection signal 165 according to a selection signal write-loop-on as a detection signal 141, wherein the selection signal write-loop-on is generated according to a control firmware of the optical disc drive and is utilized for representing the reading/writing mode. As a result, the PLL apparatus 100 is capable of selectively switching between the operation of the first PLL 101 and that of the second PLL 102 according to the selection signal write_loop_on, in order to utilize the analog control signal generating module 150 to generate an analog control signal 157 for controlling the oscillator 110, so that the frequency of a clock signal VCOCLK generated by the oscillator 110 can be controlled. In this embodiment, the oscillator 110 is a voltage-controlled oscillator (VCO), where the frequency of the clock signal VCOCLK corresponds to the magnitude of the analog control signal 157. Characteristics and operation principles of the oscillator 110 are well known in the art and therefore not explained in detail herein.

In this embodiment, the first PLL 101 is utilized for read channel control, and the second PLL 102 is utilized for write channel control. Before performing a writing operation, the optical disc drive reads an RF signal EQRF corresponding to an end portion of previously recorded data in an end region (on an optical disc accessed by the optical disc drive) adjacent to a starting location where new data is going to be written, in order to generate the clock signal VCOCLK, where the notation EQ indicates the RF signal is an equalized RF signal. In this situation, the selection signal write_loop_on is at a reading state RS. As a result, the switching unit 140 switches to engage the first PLL 101 for further operation. According to this embodiment, the frequency dividing unit 114 performs a frequency dividing operation on the clock signal VCOCLK to generate a clock signal 115, and the ADC 120 samples the RF signal EQRF according to the clock signal 115 (which is a frequency divided signal herein) to generate a digital signal 121. The digital down-sampling unit 124 performs a down-sampling operation on the digital signal 121 to generate a digital signal 125. The FD 132 and the PD 134 of the digital phase frequency detection module 130 respectively detect the frequency and phase of the digital signal 125, and then the arithmetic circuit 136 outputs the phase frequency detection signal 137 mentioned above.

When the end portion of the previously recorded data mentioned above is completely read, the selection signal write_loop_on switches from the reading state RS to a writing state WS. As a result, the switching unit 140 switches to engage the second PLL 102 for further operation. Since the clock signal VCOCLK is already generated, the second PLL 102 may slightly adjust the frequency of the clock signal VCOCLK according to a digital wobble signal WBL_WSCLK and easily lock on the frequency of the digital wobble signal WBL_WSCLK, and the optical disc drive may rapidly start to perform the writing operation. In this embodiment, the digital wobble signal WBL_WSCLK is a wobble clock corresponding to variations of wobble grooves on the optical disc accessed by the optical disc drive. The concept of wobble clock is well known in the art and therefore not explained in detail herein. As shown in FIG. 1, the digital phase frequency detection module 160 comprises a digital phase frequency detector (PFD) 162 and a frequency dividing unit, which is a down-sampling unit 164 in this embodiment. The digital PFD 162 performs phase frequency detection on the digital wobble signal WBL_WSCLK according to the clock signal VCOVLK to generate a phase frequency detection signal PFD_out. The down-sampling unit 164 performs a down-sampling operation on the phase frequency detection signal PFD_out to generate the phase frequency detection signal 165 mentioned above.

Figure 2:
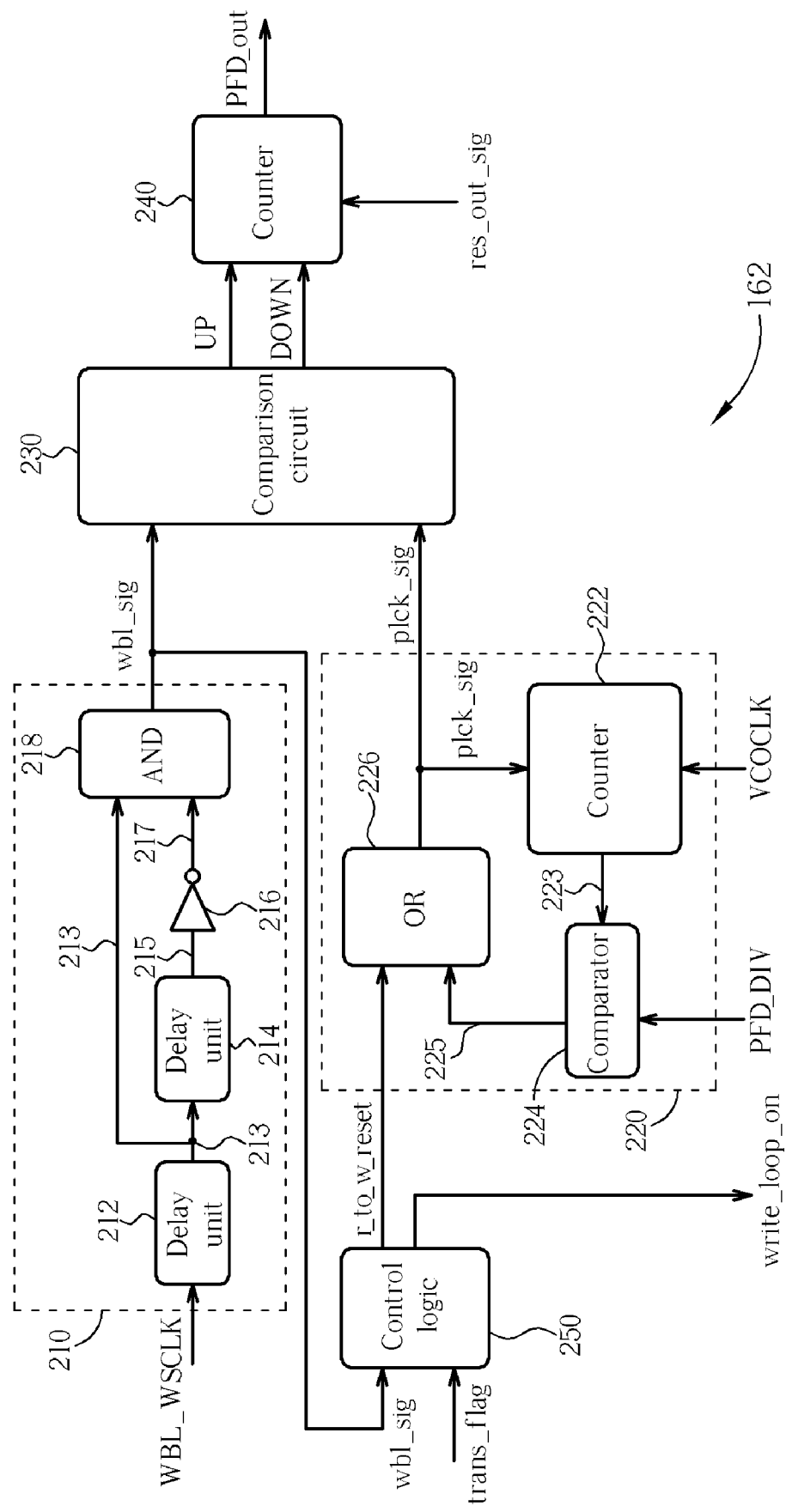
FIG. 2 is a diagram of a digital phase frequency detector (PFD) according to one embodiment of the present invention.

Please refer to FIG. 2. FIG. 2 is a diagram of the digital PFD 162 mentioned above according to one embodiment of the present invention. According to this embodiment, the digital PFD 162 comprises an edge detector 210, a clock period calculator 220, a comparison circuit 230, and a counter 240, where the edge detector 210 comprises delay units 212 and 214, an inverter 216, and an AND logic gate 218. As shown in FIG. 2, the delay units 212 and 214 are respectively utilized for delaying the digital wobble signal WBL_WSCLK and a delay signal 213 outputted by the delay unit 212, and the inverter 216 is for inverting a delay signal 215 outputted by the delay unit 214 to generate an inverted signal 217. In addition, the AND logic gate 218 performs AND logic operation on the delay signal 213 and the inverted signal 217 to generate the edge detection signal wbl_sig. As a result, the edge detector 210 is capable of detecting edges of waveforms of the digital wobble signal WBL_WSCLK (e.g. rising/falling edges) to generate the edge detection signal wbl_sig.

As shown in FIG. 2, the clock period calculator 220 comprises a counter 222, a comparator 224, and an OR logic gate 226, where the clock period calculator 220 is utilized for performing a frequency dividing operation. The counter 222 counts the clock signal VCOVLK to generate a count value 223, and the comparator 224 compares the count value 223 with a predetermined value PFD_DIV to generate a comparison result 225. When the count value 223 reaches the predetermined value PFD_DIV, the OR logic gate 226 generates a trigger signal plck_sig corresponding to the comparison result 225 to reset the counter 222 and outputs the trigger signal plck_sig to the comparison circuit 230. In this embodiment, the predetermined value PFD_DIV can be a value of 98, 64, or 93, respectively corresponding to CD, DVD+R, and DVD-R specifications.

In addition to the components mentioned above, the digital PFD 162 of this embodiment further comprises a control logic 250, where the control logic 250 receives the edge detection signal wbl_sig generated by the edge detector 210 and a flag signal trans_flag generated by the control firmware of the optical disc drive. The control logic 250 further generates a reset signal r_to_w_reset for resetting the clock period calculator 220, and generates the selection signal write_loop_on mentioned above according to logic values of the edge detection signal wbl_sig and the flag signal trans_flag. In this embodiment, when the optical disc drive switches from the reading mode to the writing mode, the control firmware sets the flag signal trans_flag to be enabled. In this situation, the control logic 250 sets the selection signal write_loop_on to be enabled at the moment when the edge detection signal wbl_sig is triggered, and the control logic 250 further outputs a pulse through the reset signal r_to_w_reset to reset the clock period calculator 220. As a result, operation of the two signals inputted into the comparison circuit 230, i.e., the edge detection signal wbl_sig and the trigger signal plck_sig, can be synchronized.

It is noted that although in this embodiment, the clock period calculator 220 continues operating in the reading mode, it is not required that the clock period calculator 220 continues so operating. According to another embodiment of the present invention, the clock period calculator 220 stops operating (e.g. being turned off) in the reading mode and resumes operation when entering the writing mode.

Figure 3:
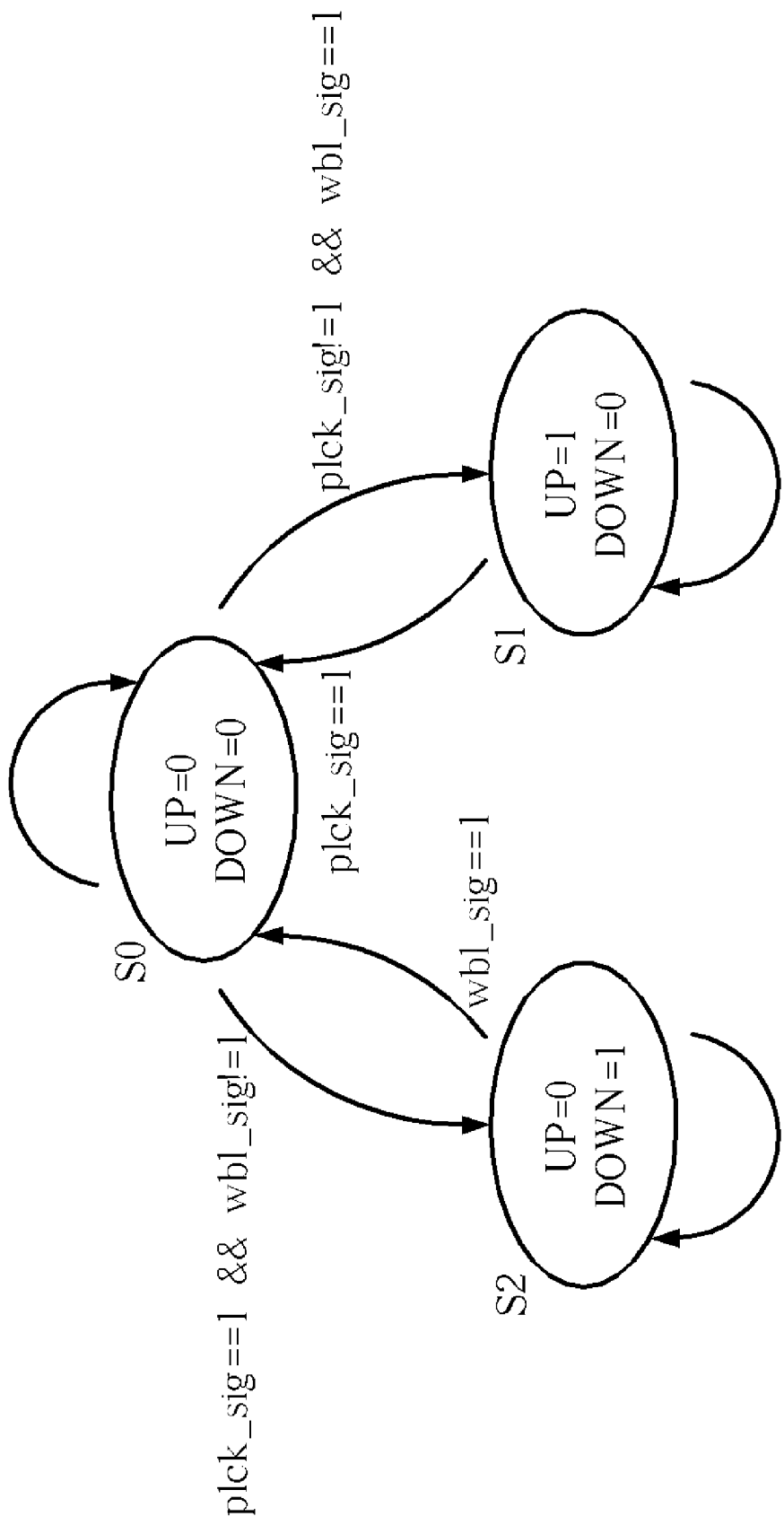
FIG. 3 is a diagram of states of the comparison circuit shown in FIG. 2.

Please refer to FIG. 1, FIG. 2, and FIG. 3. FIG. 3 is a diagram illustrating states of the comparison circuit 230 shown in FIG. 2. According to this embodiment, the comparison circuit 230 is a state machine for comparing various conditions of occurrence of a pulse in the edge detection signal wbl_sig (i.e. wbl_sig==1) and occurrence of a pulse in the trigger signal plck_sig (i.e. plck_sig==1), to compare the phase of the edge detection signal wbl_sig with the phase of the trigger signal plck_sig. When plck_sig !=1 and wbl_sig==1; that is, when the phase of the edge detection signal wbl_sig leads the phase of the trigger signal plck_sig, the comparison circuit 230 switches to state S1 and generates a rising signal UP, which corresponds to "UP=1" shown in FIG. 3. When plck_sig==1 and wbl_sig !=1; that is, when the phase of the trigger signal plck_sig leads the phase of the edge detection signal wbl_sig, the comparison circuit 230 switches to state S2 and generates a falling signal DOWN, which corresponds to "DOWN=1" shown in FIG. 3. The counter 240 calculates and maintains a difference between the number of times that the rising signal UP is set and the number of times that the falling signal DOWN is set, which is reflected in the generation of the phase frequency detection signal PFD_out. As shown in FIG. 1, after reading the phase frequency detection signal 165, the analog control signal generating module 150 generates a reset signal res_out_sig to reset the counter 240 shown in FIG. 2.

In the PLL circuits of the embodiments mentioned above, most of the components utilize digital configurations and therefore these embodiments benefit from advantages such as better adjustability. In addition, by utilizing the analog-based VCO, signal jitter phenomena can be greatly reduced. Hence, the PLL circuits according to embodiments of the present invention benefit from the advantages of both digital and analog circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase-locked loop (PLL) apparatus, comprising:
   a first digital phase frequency detector (PFD) for generating a first phase frequency detection signal according to a first signal;
   a second digital PFD for generating a second phase frequency detection signal according to a second signal;
   a switching unit coupled to the first and second digital PFDs for selectively outputting the first phase frequency detection signal or the second phase frequency detection signal according to a selection signal;
   a digital loop filter (LF) coupled to the switching unit for filtering the signal outputted by the switching unit;
   a DAC, for performing a digital to analog conversion to a filtered result from the digital loop filter to generate an analog signal; and
   an oscillator coupled to the digital LF for generating an oscillation signal according to the analog signal.

2. The PLL apparatus of claim 1, being utilized in an optical disc drive.

3. The PLL apparatus of claim 2, wherein the first signal is an RF signal.

4. The PLL apparatus of claim 2, wherein the second signal is a wobble signal.

5. The PLL apparatus of claim 2, wherein the optical disc drive generates the selection signal according to whether to operate at a reading mode or a writing mode to control the switching unit.

6. The PLL apparatus of claim 1, further comprising:
   a low-pass filter (LPF) coupled between the digital LF and the oscillator.

7. The PLL apparatus of claim 1, wherein the oscillator is an analog-based voltage-controlled oscillator (VCO).

8. The PLL apparatus of claim 1, wherein the first signal is inputted into an analog-to-digital converter (ADC) for sampling the first signal to generate a third signal, and the first digital PFD is coupled to the ADC to generate the first phase frequency detection signal according to the third signal.

9. The PLL apparatus of claim 8, further comprising:
   a first frequency dividing unit coupled between the ADC and the first digital PFD.

10. The PLL apparatus of claim 1, further comprising:
    a second frequency dividing unit coupled between the second digital PFD and the switching unit.

11. A phase-locking method of an optical disc drive, comprising:
    digitally detecting the phase and frequency of an RF signal according to an oscillation signal to generate a first phase frequency detection signal;
    digitally detecting the phase and frequency of a wobble signal according to the oscillation signal to generate a second phase frequency detection signal;
    selectively outputting the first phase frequency detection signal or the second phase frequency detection signal;
    digitally loop-filtering the outputted signal to generate a loop-filtered signal;
    performing a digital to analog conversion to a filtered result to generate an analog signal; and
    generating the oscillation signal according to the analog signal.

12. The phase-locking method of claim 11, further comprising:
    utilizing an analog voltage-controlled oscillator (VCO) to generate the oscillation signal.

13. The phase-locking method of claim 11, further comprising:
    performing analog-to-digital conversion on the RF signal.

* * * * *